United States Patent [19]

Ibuchi

[11] Patent Number: 4,935,768
[45] Date of Patent: Jun. 19, 1990

[54] APPARATUS FOR TRANSPORTING A PHOTOSENSITIVE SHEET
[75] Inventor: Yoshiaki Ibuchi, Nara, Japan
[73] Assignee: Sharp Kabushiki Kaisha, Osaka, Japan
[21] Appl. No.: 378,588
[22] Filed: Jul. 11, 1989
[30] Foreign Application Priority Data Jul. 15, 1988 [JP] Japan .............................. 63-94430[U]

[51] Int. Cl.$^5$ .............................................. G03B 27/32
[52] U.S. Cl. ....................................... 355/27; 355/74; 355/125
[58] Field of Search ..................... 355/27, 28, 74, 125; 430/138

[56] References Cited

U.S. PATENT DOCUMENTS 4,624,560  11/1986  Beery .................................. 355/27
4,777,513  10/1988  Nelson ................................ 355/27
4,825,251   4/1989  Nelson et al. ........................ 355/27

Primary Examiner—L. T. Hix
Assistant Examiner—Khanh Dang
Attorney, Agent, or Firm—Irell & Manella

[57] ABSTRACT

An apparatus for transporting a photosensitive sheet in which the photosensitive sheet is drawn out by a predetermined length, with the foremost portion of its image-forming area being illuminated by a lamp, and is transported backward by the same length before an image-forming process, and accordingly pressure-rupturable capsules on the said foremost portion of the image-forming area of the photosensitive sheet are hardened, thereby no colored image being formed on the corresponding portion of an image-receiving sheet in the image-forming process, so that the foremost portion of the image-receiving sheet does not stick to an upper heat roller and can thus be readily separated from heat rollers.

3 Claims, 4 Drawing Sheets

APPARATUS FOR TRANSPORTING A PHOTOSENSITIVE SHEET

BACKGROUND OF THE INVENTION

1. Field of the invention:

This invention relates to an apparatus for successively transporting a photosensitive sheet from a roll of the sheet, the said apparatus being used in an apparatus for the formation of images utilizing the photosensitive sheet and an image-receiving sheet.

2. Description of the prior art:

In recent years, an apparatus for the formation of images which uses a photosensitive sheet coated with pressure-rupturable capsules containing chromogenic materials that are hardened when exposed to light and an image-receiving sheet coated with developing materials that react with the chromogenic materials to give rise to color images has been developed (Japanese Laid-Open Patent Publication No. 58-88739).

Such an apparatus comprises an apparatus for transporting a photosensitive sheet, in which the sheet is successively drawn out from a roll of the photosensitive sheet, and transported through a light-emitting section and a pressure-transfer section and then wound up around a take up rod. The photosensitive sheet is exposed to light reflected from an original at the above-mentioned light-emitting section. The light reflected from the original selectively illuminates the pressure-rupturable capsules on the photosensitive sheet so that some of the capsules are exposed to the light to be hardened and the others are not exposed to the light to be left unchanged, resulting in a latent image corresponding to the image of the original. The photosensitive sheet on which the latent image has been formed is then transported into the pressure-transfer section, where the photosensitive sheet is placed together with the image-receiving sheet and pressure is applied thereto. Thus, the pressure-rupturable capsules that have not been hardened rupture, and the chromogenic materials contained therein flow out and are transferred onto the image-receiving sheet. Then the chromogenic materials react with the developing materials coated on the image-receiving sheet, which gives rise to color in the chromogenic materials, thereby a colored image corresponding to the latent image being formed on the image-receiving sheet.

Japanese Laid-Open Patent Publication No. 61-24495 discloses the provision of a heating device for heating the image-receiving sheet on which the colored image has been formed, so as to enhance the reaction between the chromogenic materials and the developing materials, which makes the colored image glossy and more distinct. In general, such a heating device comprises a pair of heat rollers; that is, an upper roller including a heater therein and a lower roller pressed against the upper roller.

When the image-receiving sheet is heated by the upper heat roller including the heater, the chromogenic materials reacting with the developing materials on the sheet are softened, which may cause an offset, i.e., some of the chromogenic materials on the image-receiving sheet may adhere to the upper roller. Thus, the image-receiving sheet tends to stick to the upper roller due to the softened materials. When the latent image is formed up to the foremost portion of an image-forming area of the photosensitive sheet, the colored image is also formed up to the corresponding portion of the image-receiving sheet. In such a case, the foremost portion of the image-receiving sheet tends to stick to the upper roller due to the softened materials, which makes it difficult for the image-receiving sheet to be separated from the heat rollers. This interferes with the smooth operation of the whole apparatus for the formation of images.

SUMMARY OF THE INVENTION

The apparatus for transporting a photosensitive sheet of this invention, which overcomes the above-discussed and numerous other disadvantages and deficiencies of the prior art, is used in an apparatus for the formation of images utilizing a photosensitive sheet coated with pressure-rupturable capsules containing chromogenic materials therein and an image-receiving sheet coated with developing materials; said apparatus for transporting a photosensitive sheet being arranged to draw out the photosensitive sheet from a roll of the sheet and transport it through a light-emitting section in which said photosensitive sheet is illuminated with light, a hardening section in which the pressure-rupturable capsules on a portion of said photosensitive sheet that has been illuminated with light are hardened and a pressure-transfer section in which said image-receiving sheet is disposed onto said photosensitive sheet under an appropriate pressure and then wind it up around a take up rod, wherein said apparatus comprises: a lamp which is disposed slightly ahead of said light-emitting section and which directly illuminates the foremost portion of an image-forming area of said photosensitive sheet, a means for transporting forward said photosensitive sheet by a predetermined length with said lamp on, thereby said foremost portion of the next image-forming area of said photosensitive sheet being directly illuminated by said lamp after the preceding image-forming process, and a means for transporting backward said photosensitive sheet by said predetermined length before the next image-forming process, said photosensitive sheet transported backward being exposed to light reflected from an original at said light-exposure section in said next image-forming process.

The pressure-rupturable capsules on said foremost portion of said image-forming area of said photosensitive sheet, which have been illuminated with light from said lamp, do not rupture even though said portion of said photosensitive sheet is pressed against the corresponding portion of said image-receiving sheet, so that no chromogenic materials flow out from said capsules to react with the developing materials of said image-receiving sheet, resulting in no colored image on said portion of said image-receiving sheet.

In a preferred embodiment, the length L by which said photosensitive sheet is transported forward or backward by means of said transporting means is represented by the following equation with the length $\Delta l$ of said foremost portion of said image-forming area of said photosensitive sheet and the length m between said light-emitting section and said hardening section of said photosensitive sheet:

$$L = \Delta l + m.$$

Thus, the invention described herein makes possible the objective of providing an apparatus for transporting a photosensitive sheet in which the photosensitive sheet is drawn out by a predetermined length, with the foremost portion of its image-forming area being illuminated by a lamp, and is transported backward by the same length before an image-forming process, and accordingly pressure-rupturable capsules on the said foremost portion of the image-forming area of the photosensitive sheet are hardened, thereby no colored image being formed on the corresponding portion of an image-receiving sheet in the image-forming process, so that the foremost portion of the image-receiving sheet does not stick to an upper heat roller and can thus be readily separated from the heat rollers.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
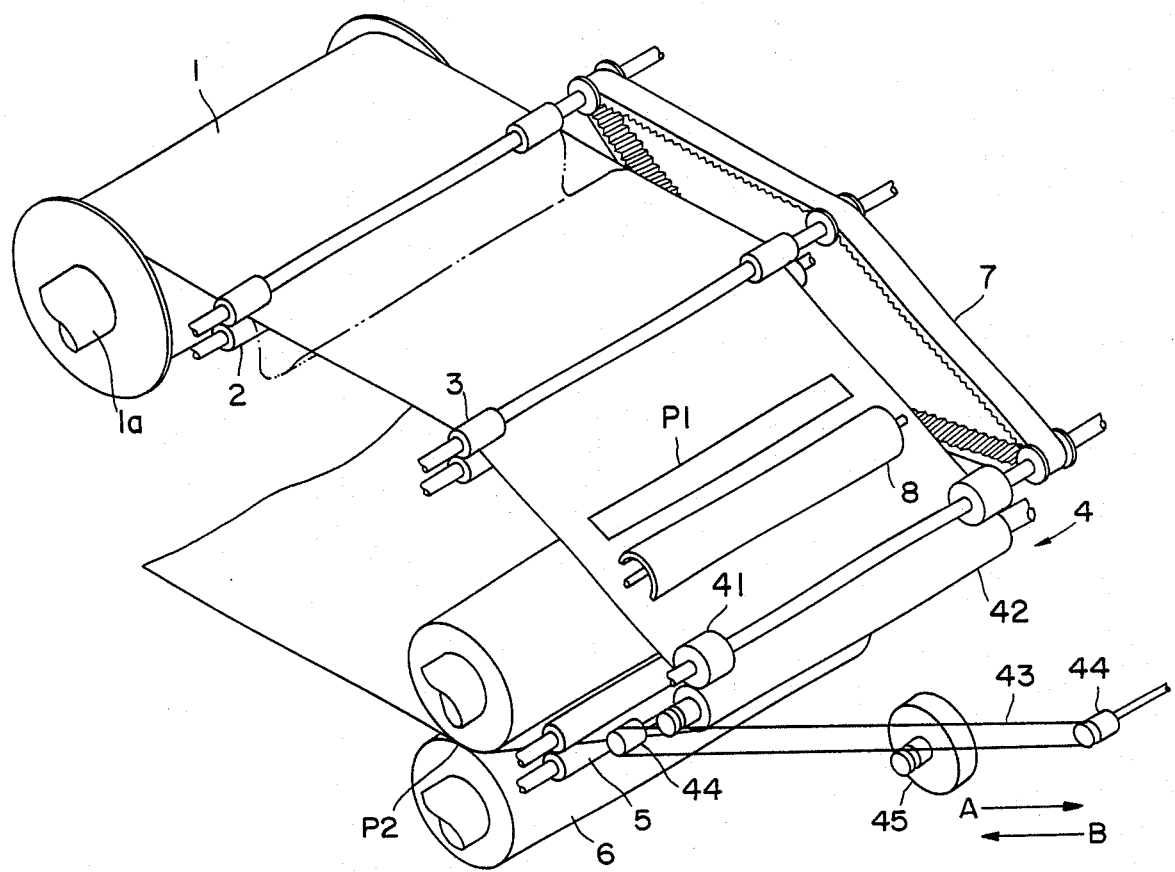
FIG. 1 is a perspective view of an apparatus for transporting a photosensitive sheet of this invention.
Figure 2:
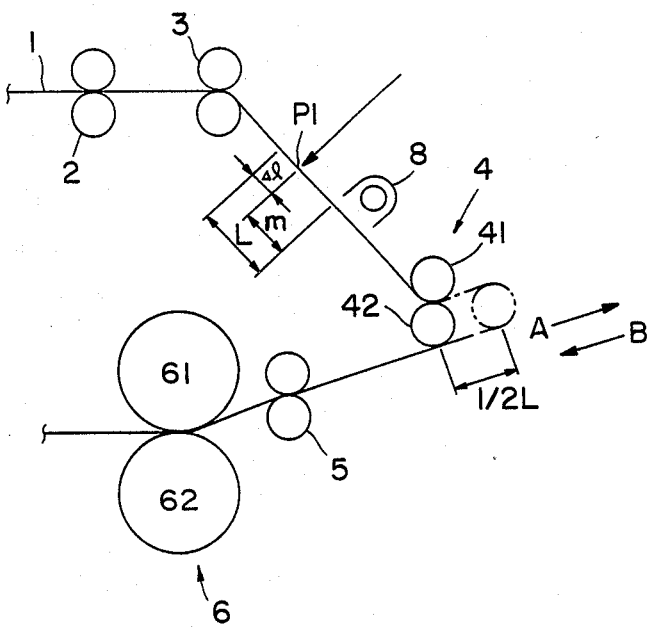
FIG. 2 is a diagrammatic sectional side elevation of the apparatus for transporting a photosensitive sheet shown in FIG. 1.

FIG. 1 is a perspective view of an apparatus for transporting a photosensitive sheet of this invention. FIG. 2 is a diagrammatic sectional side elevation of the apparatus for transporting a photosensitive sheet shown in FIG. 1. A photosensitive sheet 1 comprises a sheet made of polyester or the like, one side of which is coated with pressure-rupturable capsules containing chromogenic materials which are hardened when exposed to light. The photosensitive sheet 1 is rolled up around a sheet-feeding rod 1a with its capsule-coated side out, constituting a roll of the photosensitive sheet. The sheet-feeding rod 1a includes a lock mechanism (not shown) which locks the sheet-feeding rod 1a so as to prevent the photosensitive sheet 1 from being slack when the sheet is not transported. The photosensitive sheet 1 is drawn out from the roll of the sheet and transported through pairs of transporting rollers 2, 3, 4, and 5 and a pair of pressure rollers 6 to a take up rod (not shown), around which the photosensitive sheet 1 is then wound.

The pairs of transporting rollers 2, 3, 4, and 5 are driven by a main motor (not shown) via a driving belt 7. The main motor also drives the pair of pressure rollers 6. Each pair of transporting rollers 2, 3 and 5 and pressure rollers 6 has a clutch which allows the rollers to be operated by the main motor only when required. The rollers rotate when their clutches are engaged and their rotation stops when their clutches are disengaged.

The pair of transporting rollers 4 is composed of an upper roller 41 and a buffer roller 42. The buffer roller 42 changes the direction of the sheet transportation by about 180 degrees so that the photosensitive sheet 1 is reversed before being transported to the pair of transporting rollers 5 and to the pair of pressure rollers 6. The shaft of the buffer roller 42 is connected with two idler pulleys 44 and the shaft of a motor 45 by means of a wire 43 as shown in FIG. 1, in such a manner that the buffer roller 42 moves in the direction of arrow A or B with the rotation of the motor 45. When the buffer roller 42 moves in the direction of arrow A, the photosensitive sheet 1 is drawn out from the roll of the sheet.

The pair of pressure rollers 6, which serves as a pressure-transfer section P2, is composed of an upper roller 61 and a lower roller 62. The latter is pressed against the former at a pressure of about 100 kg/cm, so that the pressure-rupturable capsules that have not been hardened are pressurized to rupture, as will be described in more detail below.

Between the pairs of transporting rollers 3 and 4 is provided a light-emitting section P1, at which light reflected from an original passes through a slit to illuminate the photosensitive sheet 1. A lamp 8, which is a fluorescent lamp or the like, is disposed slightly ahead of the light-emitting section P1, in such a manner that it faces the photosensitive sheet 1.

An image-forming process in an apparatus for the formation of images using the apparatus of this invention will now be described. First, the rotation of the transporting rollers 5 and 6 is suspended with their clutches disengaged, while at the same time the motor 45 rotates to move the buffer roller 42 in the direction of arrow A with the transporting rollers 2 and 3 rotating, so as to draw out an appropriate length of the photosensitive sheet 1 from the roll of the sheet. As the photosensitive sheet 1 is being drawn out, an image-forming area thereof passes through the light-emitting section P1, where it is exposed to light reflected from an original through the slit. The reflected light selectively illuminates the image-forming area so that some of the pressure-rupturable capsules thereon receive the light to be hardened, and the other capsules do not receive the light and are left unchanged, resulting in a latent image corresponding to the original.

Thereafter, the sheet-feeding rod 1a is locked by means of its lock mechanism so that the photosensitive sheet 1 will not be drawn out any more, and at the same time the motor 45 rotates backward so as to move the buffer roller 42 in the direction of arrow B while the transporting rollers 5 and the pressure rollers 6 are rotating with their clutches engaged. Thus the image forming area of the photosensitive sheet 1 on which the latent image has been formed is transported to the pressure-transfer section P2, where at the same time an image-receiving sheet that is coated with developing materials is also supplied. The photosensitive sheet 1 is brought together with the image-receiving sheet and they are pressed against each other by the pressure rollers 6, so that the pressure-rupturable capsules that have not hardened rupture, thereby the chromogenic materials contained in those capsules flow out onto the image-receiving sheet. The chromogenic materials then react with the developing materials coated on the image-receiving sheet, which gives rise to color in the chromogenic materials. In this way, a colored image corresponding to the latent image is formed on the image-receiving sheet.

In the copying operation of the apparatus for the formation of images using the apparatus of this invention, the foremost portion of the image-forming area of the photosensitive sheet 1 is directly illuminated by the lamp 8, between two successive cycles of the above-mentioned image-forming process, as will now be described below.

Figure 3A:
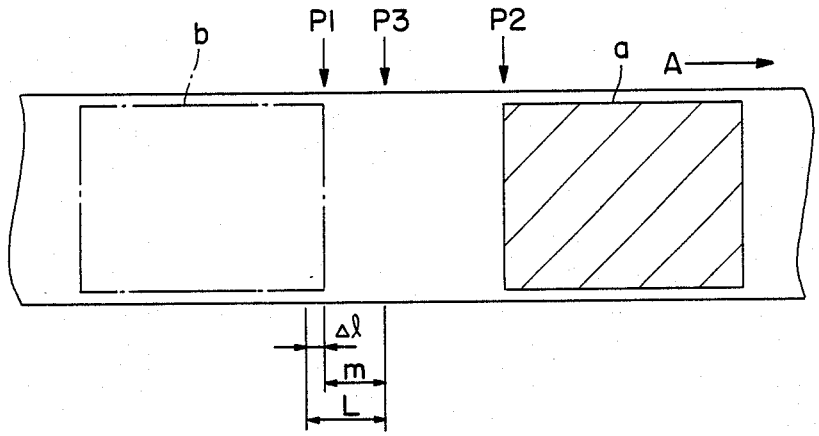
FIG. 3A is a plan view showing the photosensitive side of a photosensitive sheet with which the preceding image-forming process has been carried out.

FIG. 3A illustrates the capsule-coated side or photosensitive side of the photosensitive sheet 1 with which the preceding image-forming process has been carried out in the same way as described above. The preceding latent image has been formed on an image-forming area a shown by oblique lines, the back end of which is now located at the pressure-transfer section P2. The next latent image will be formed on an image-forming area b shown by a dash-dot line. The location of the lamp 8, which will irradiate and harden the pressure-rupturable capsules on the foremost portion with a length $\Delta l$ of the image-forming area b, is shown by P3 as a hardening section.

Figure 3B:
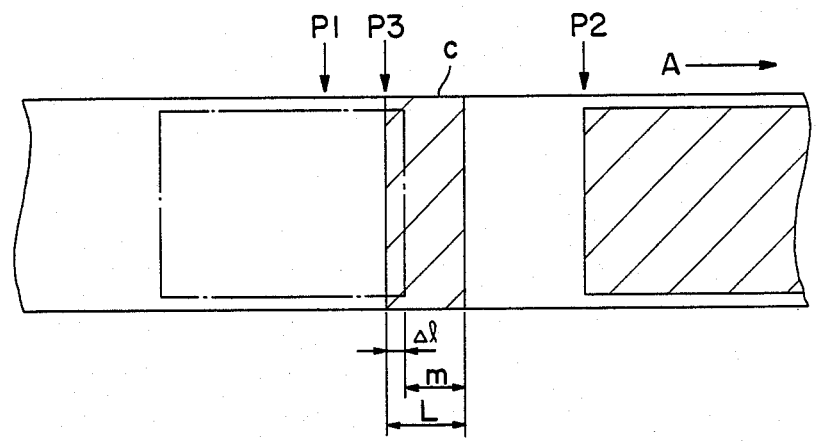
FIG. 3B is a plan view showing the photosensitive side of the photosensitive sheet which has been transported forward so that the foremost portion of the next image-forming area is illuminated by a lamp.

Before the next image-forming process starts, first, the rotation of the transporting rollers 5 and the pressure rollers 6 is suspended with their clutches disengaged and the motor 45 rotates to move the buffer roller 42 in the direction of arrow A by half of a length L with the transporting rollers 2 and 3 rotating, so that the photosensitive sheet 1 is drawn out by the length L to be in the position shown in FIG. 3B. The length L is the total of the length $\Delta l$ of the above-mentioned foremost portion of the image-forming area b and the length m between the light-emitting section P1 and the hardening section P3 (that is, $L=\Delta l+m$). Thus, as the photosensitive sheet 1 is being drawn out by the length L, an area c shown by oblique lines in FIG. 3B is illuminated by the lamp 8 of the hardening section P3, thereby the pressure rupturable capsules thereon being hardened. Thus, the capsules on the foremost portion with a length $\Delta l$ of the image-forming area b are hardened.

Then, the rotation of the pair of transporting rollers 2 is suspended with its clutch disengaged while the rotation of the transporting rollers 5 and the pressure rollers 6 remains suspended, and at the same time the motor 45 drives the buffer roller 42 to move in the direction of arrow B by half of the length L with the transporting rollers 3 being rotated backward. As a result, the photosensitive sheet 1 is drawn back by the length L to be slack in the region between the pairs of the transporting rollers 2 and 3, as shown by the line of dashes and double dots in FIG. 1. Thus, the image-forming area b on which the next latent image will be formed comes to the position shown in FIG. 3C, the front end of which is at the light-emitting section P1 again. Because the transporting rollers 3 rotate backward while the buffer roller 42 is moving backward as described above, the portion of the photosensitive sheet 1 between the transporting rollers 3 and 4 will not be loosened. Thus, the photosensitive sheet 1 can be properly placed at the light-emitting section P1 which is between these rollers.

Figure 3C:
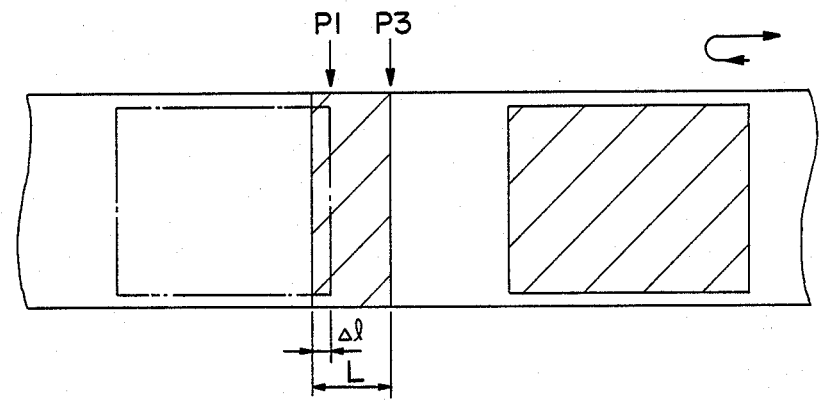
FIG. 3C is a plan view showing the photosensitive side of the photosensitive sheet which has been transported backward to be ready for the next image-forming process.

Immediately after coming back to the position shown in FIG. 3C, the image-forming area b is substituted to the next image-forming process, thereby a latent image being formed thereon, which is developed and transferred onto the image-receiving sheet, as in the same way as described above.

In this way, since the foremost portion with the length $\Delta l$ of the image-forming area b is illuminated by the lamp 8 and the pressure-rupturable capsules thereon are hardened before being exposed to the light reflected from the original at the light-emitting section, a latent image will not be formed on this portion. Thus, even when the photosensitive sheet 1 is pressed against the image-receiving sheet by the pressure rollers 6, these hardened pressure-rupturable capsules on this portion do not rupture, so that no chromogenic materials flow out from the capsules to react with the developing materials coated on the corresponding portion of the image-receiving sheet, resulting in no colored image on the same portion of the image-receiving sheet.

After the above-mentioned copying operation is completed, the image-receiving sheet on which the colored image has been formed is transported into heat rollers (not shown) composed of an upper roller including a heater and a lower roller pressed against the upper roller. The image-receiving sheet is heated by the upper heat roller, which makes the colored image thereon glossy and more distinct. If a colored image is formed up to the foremost portion of the image-receiving sheet, the chromogenic materials on this portion are softened by being heated and they stick to the upper heat roller, so that the front end of the image-receiving sheet adheres to the upper roller, which makes it difficult for the sheet to be separated from the heat rollers. In the apparatus for the formation of images using the apparatus of this invention, however, since no colored image is formed on the foremost portion of the image-receiving sheet and accordingly no chromogenic materials are transferred thereto as described above, the front end of the sheet will not stick to the upper roller. Therefore, the image-receiving sheet can be readily separated from the heat rollers, resulting in a smooth operation of the whole apparatus for the formation of images using the apparatus of this invention.

Figure 4:
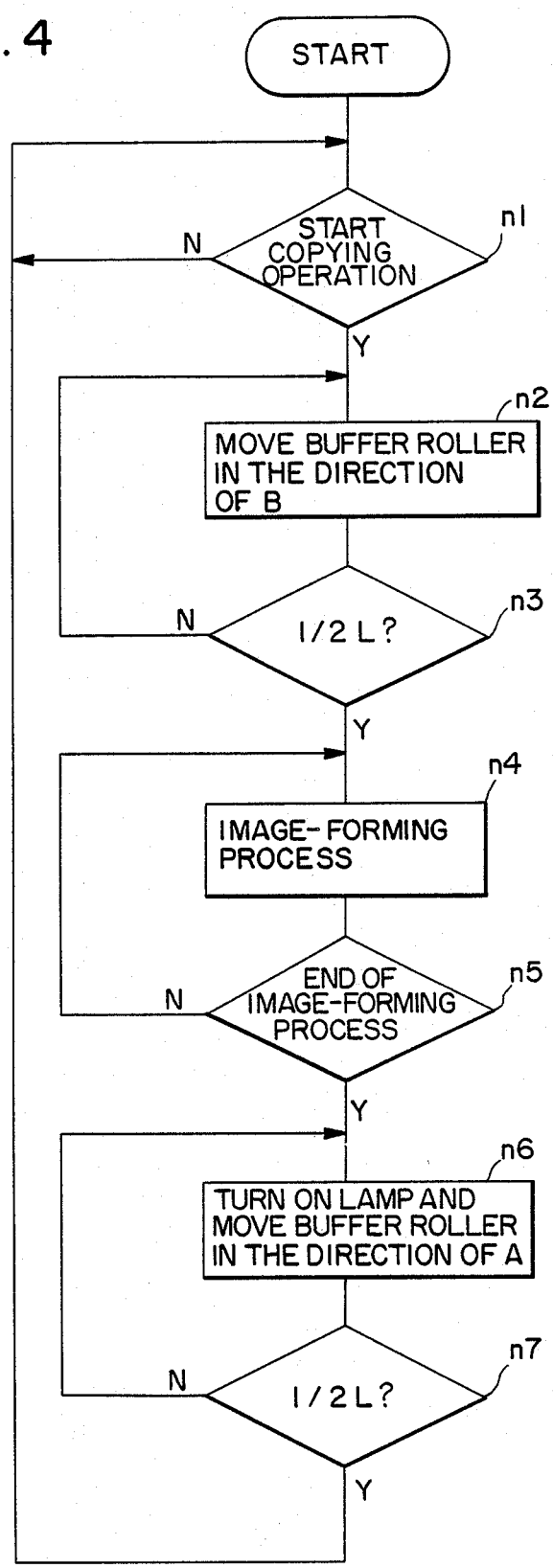
FIG. 4 is a flow-chart showing a photosensitive sheet-transporting procedure in the apparatus of this invention.

FIG. 4 is a flow-chart showing a photosensitive sheet-transporting procedure in the apparatus of the invention.

After a cycle of the image-forming process is completed in steps n4 and n5, the lamp 8 is turned on and the buffer roller 42 moves in the direction of arrow A by half of the length L to draw out the photosensitive sheet 1 by the length L, so that the area c including the foremost portion with the length $\Delta l$ of the next image-forming area b is illuminated by the lamp 8 in the steps n6 and n7. Thus, the pressure-rupturable capsules on this portion are hardened.

Thereafter, the next copying operation is started in step n1, so that the buffer roller 42 moves in the direction of arrow B by half of the length L with the transporting rollers 3 rotating backward so as to draw back the photosensitive sheet 1 by the length L in steps n2 and n3. Then, the next cycle of the image-forming process is carried out in the steps n4 and n5.

In this way, after a cycle of the image-forming process is finished, the photosensitive sheet is transported forward by a predetermined length while the foremost portion of its image-forming area being illuminated by the lamp in the steps n6 and n7, and the sheet is then transported backward by the same length in the steps n2 and n3 before the next cycle of the image-forming process.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. An apparatus for transporting a photosensitive sheet, which is used in an apparatus for the formation of images utilizing a photosensitive sheet coated with pressure-rupturable capsules containing chromogenic materials therein and an image-receiving sheet coated with developing materials; said apparatus for transporting a photosensitive sheet being arranged to draw out the photosensitive sheet from a roll of the sheet and transport it through a light-emitting section in which said photosensitive sheet is illuminated with light, a hardening section in which the pressure-rupturable capsules on a portion of said photosensitive sheet that has been illuminated with light are hardened and a pressure-transfer section in which said image-receiving sheet is disposed onto said photosensitive sheet under an appropriate pressure and then wind it up around a take up rod, wherein said apparatus comprises:
a lamp which is disposed slightly ahead of said light-emitting section and which directly illuminates the foremost portion of an image-forming area of said photosensitive sheet,
a means for transporting forward said photosensitive sheet by a predetermined length with said lamp on, thereby said foremost portion of the next image-forming area of said photosensitive sheet being directly illuminated by said lamp after the preceding image-forming process, and
a means for transporting backward said photosensitive sheet by said predetermined length before the next image-forming process, said photosensitive sheet transported backward being exposed to light reflected from an original at said light-exposure section in said next image-forming process.

2. An apparatus according to claim 1, wherein the pressure-rupturable capsules on said foremost portion of said image-forming area of said photosensitive sheet, which have been illuminated with light from said lamp, do not rupture even though said portion of said photosensitive sheet is pressed against the corresponding portion of said image-receiving sheet, so that no chromogenic materials flow out from said capsules to react with the developing materials of said image-receiving sheet, resulting in no colored image on said portion of said image-receiving sheet.

3. An apparatus according to claim 1, wherein a length L by which said photosensitive sheet is transported forward or backward by means of said transporting means is represented by the following equation with the length $\Delta l$ of said foremost portion of said image-forming area of said photosensitive sheet and the length m between said light-emitting section and said hardening section of said photosensitive sheet:

$$L = \Delta l + m.$$

* * * * *